United States Patent
Kannengießer et al.

(10) Patent No.: US 10,024,942 B2
(45) Date of Patent: Jul. 17, 2018

(54) MAGNETIC RESONANCE METHOD AND APPARATUS TO GENERATE A RESIDUAL MAP AS AN INDICATOR OF SIGNAL MODEL CONSISTENCY

(71) Applicant: Siemens Healthcare GmbH, Erlangen (DE)

(72) Inventors: Stephan Kannengießer, Wuppertal (DE); Marcel Dominik Nickel, Herzogenaurach (DE); Xiaodong Zhong, Lilburn, GA (US)

(73) Assignee: Siemens Healthcare GmbH, Erlangen (DE)

( * ) Notice: Subject to any disclaimer, the term of this patent is extended or adjusted under 35 U.S.C. 154(b) by 603 days.

(21) Appl. No.: 14/644,583

(22) Filed: Mar. 11, 2015

(65) Prior Publication Data
US 2016/0266224 A1     Sep. 15, 2016

(51) Int. Cl.
*G01R 33/56*     (2006.01)
*G01R 33/48*     (2006.01)
*G01R 33/50*     (2006.01)

(52) U.S. Cl.
CPC ..... *G01R 33/5608* (2013.01); *G01R 33/4828* (2013.01); *G01R 33/50* (2013.01)

(58) Field of Classification Search
CPC . G01R 33/5608; G01R 33/4828; G01R 33/50
See application file for complete search history.

(56) References Cited

U.S. PATENT DOCUMENTS

| | | | |
|---|---|---|---|
| 2012/0121145 A1 | 5/2012 | Funabasama et al. | |
| 2014/0233817 A1* | 8/2014 | Hernando | G01R 33/4828 382/131 |
| 2016/0038047 A1* | 2/2016 | Urman | A61B 5/042 600/410 |
| 2016/0247299 A1* | 8/2016 | Tan | G06T 11/003 |
| 2016/0282433 A1* | 9/2016 | Kannengiesser | G01R 33/4828 |

OTHER PUBLICATIONS

Bacher et al., Signal Model Consistency Analysis of Different Protocols Echo Liver PDFF and R2* Quantification, Proc. Intl. Soc. Mag. Reson. Models Med. 2 (2014) p. 1672.
Hernando et al., Chemical Shift-Based Water/Fat Separation: A Comparison of Signal Models, Magnetic in Medicine 64:(2010), pp. 811-822.
Bydder et al., Relaxation Effects in the Quantification of Fat using Gradient Echo Imaging, Magn Reson Imaging, Apr. 2008; 26(3), 347-359.
Ren et al., Composition of adipose tissue and marrow fat in humans by 1H NMR at 7 Tesla, Sep. 2008 The Journal of Lipid Research, 49, 2055-2062.

* cited by examiner

*Primary Examiner* — Rodney Bonnette
(74) *Attorney, Agent, or Firm* — Schiff Hardin LLP

(57) ABSTRACT

In a magnetic resonance (MR) apparatus and method to evaluate the consistency of a signal model used to generate a quantitative parameter map, the residual of the quantitative parameter map is calculated and a residual map is generated. The residual map is displayed together with the quantitative parameter map, with the residual map serving as an indicator of the quality of fit of the signal model.

9 Claims, 4 Drawing Sheets

MAGNETIC RESONANCE METHOD AND APPARATUS TO GENERATE A RESIDUAL MAP AS AN INDICATOR OF SIGNAL MODEL CONSISTENCY

BACKGROUND OF THE INVENTION

Field of the Invention

The present invention concerns magnetic resonance imaging, and in particular a method and apparatus for magnetic resonance imaging wherein a signal model is used to generate a quantitative parameter map.

Description of the Prior Art

Magnetic resonance (MR) is a known modality with which images of the inside of an examination subject can be generated. Such a procedure is known as magnetic resonance imaging, or magnetic resonance tomography.

In simple terms, an examination subject is situated in a magnetic resonance apparatus in which a strong, static, homogenous basic magnetic field (also called a $B_0$ field) is generated, having a field strength of 1.5 T Tesla, or more, which causes nuclear spins in the subject to become oriented along the direction of the basic magnetic field. Radio-frequency (RF) excitation pulses are radiated into the examination subject, which trigger the emission of nuclear magnetic resonance signals by the nuclear spins. These magnetic resonance signals are detected and are entered into a memory that is organized as k-space. The k-space data in the memory are used to reconstruct an image of the subject.

During the acquisition of the magnetic resonance signals, rapidly activated magnetic gradient fields are superimposed on the basic magnetic field, which spatially code the measurement data. These magnetic field gradients determine the points in the k-space memory at which the measurement data are entered. The acquired measurement data are digitized and stored as complex numerical values in k-space. An MR image can be reconstructed from k-space populated with such values by, for example, a multi-dimensional Fourier transform of the k-space data.

The contrast that is present in a magnetic resonance image is dependent on several physical properties of the nuclei that have been excited in order to obtain the MR data. The contrast that is present in an MR image is used to identify and characterize tissue properties that are shown in the image, ultimately for the purpose of diagnosing a pathological condition. Quantitative measurements in magnetic resonance imaging have recently gained much interest, such as calculation of the fat fraction (FF) and the transverse relaxation ($R_2^*$) from multi-gradient-echo images.

A typical way of determining quantitative parameters is to use a signal model, and to solve for the unknown model parameters, such as FF or $R_2^*$, given a series of measurements, e.g. multiple gradient-echo images.

It is typical that the signal model will contain constants that enter into the model. These constants can be associated with hardware of the magnetic resonance apparatus, such as receiver coil sensitivities, and those types of constants are typically measured in a calibration scan that takes place before the acquisition of the actual diagnostic MR data. The constants that enter into the signal model may also be given by the laws of physics, such as the Larmor frequency. Other constants that enter into the signal model are assumed to be known. An example of the latter category is the signal interference of water and triglycerides in the liver, which is typically determined once for each of a number of subjects, and then is assumed to be constant for all patients.

A general form of the signal model can be represented as $$s = \text{function of } (p, c, k)$$

wherein s is the vector of acquired signals, p is the vector of unknowns, c is the vector of constants, and k is the vector of assumed constants.

An important quality measure of the fitting process is the residual, which is a well-known quantity in the field of statistics and optimization. In general terms, the residual of an observed value is the difference between the observed value and the estimated function value. This can be generally represented as $$r = s - s' = s - \text{function of } (p0, c, k)$$

wherein p0 is the result of a fitting operation. From the residual and other variables, other, integral, measures for the quality of the fitting operation can be calculated, such as "chi squared," or "r squared" or the "rms error." These measures may be calculated inherently in the particular fitting algorithm used, and may constitute the "cost function" to be minimized.

Conventionally, the signal model constants in the third category are merely assumed to be known. As a consequence, any deviations from the true values of those constants lead to errors in the quantitative parameters to be determined. In some cases, the constants are reinterpreted as unknowns, and the relevant equation or equations are solved for these unknowns, along with the other unknowns. However, this is unfavorable since it makes the whole fitting operation less numerically stable, and the calculated quantitative parameters of interest more noisy.

An example of a signal model used in the context of chemical shift-based water/fat separation is described in the article "Chemical Shift-Based Water Fat Separation: A Comparison of Signal Models," Hernando et al., Magnetic Resonance in Medicine, Vol. 64 (2010), pp. 811-822. The evaluation of the consistency of different signal models, by generating a quantitative parameter map, is described in "Signal Model Consistency Analysis of Different Protocols and Spectral Models in Multi Gradient Echo Liver PDFF and $R_2^*$ Quantification," Bacher et al., Proceedings of the International Society of Magnetic Resonance in Medicine, $22^{nd}$ annual meeting (2014), p. 1672.

SUMMARY OF THE INVENTION

An object of the present invention is to provide a magnetic resonance apparatus and method wherein the quality of fit of a signal model that is employed in order to generate a quantitative parameter map can be evaluated in a visual presentation.

In accordance with the invention, this object is achieved in a magnetic resonance method and apparatus wherein the MR apparatus is operated to acquire MR data, and a quantitative parameter map is generated from the acquired MR data, using a signal model. A residual of the quantitative parameter map is calculated and, from the calculated residual, a residual map is generated. The residual map is displayed together with the quantitative parameter map, with the residual map serving as an indicator of the quality of fit of the signal model.

The residual map is thus itself a parameter map, with the residual, or a value derived from the residual, being used to generate the residual map. If the residual itself is not used to generate the parameter map, the value derived therefrom that is used to generate the parameter map can be, for example, squared or chi squared.

For example, in the case of a fat spectral model for the liver of a patient, if the residual map indicates that the signal model fit is not good, it may be deduced that the fat composition of the particular liver tissue in question is not what it was assumed to be when the signal model was created. A modification in the signal model can then be made, and another residual map can be generated. This procedure can be iteratively repeated until an acceptable fit of the signal model is achieved.

DESCRIPTION OF THE PREFERRED EMBODIMENTS

Figure 1:
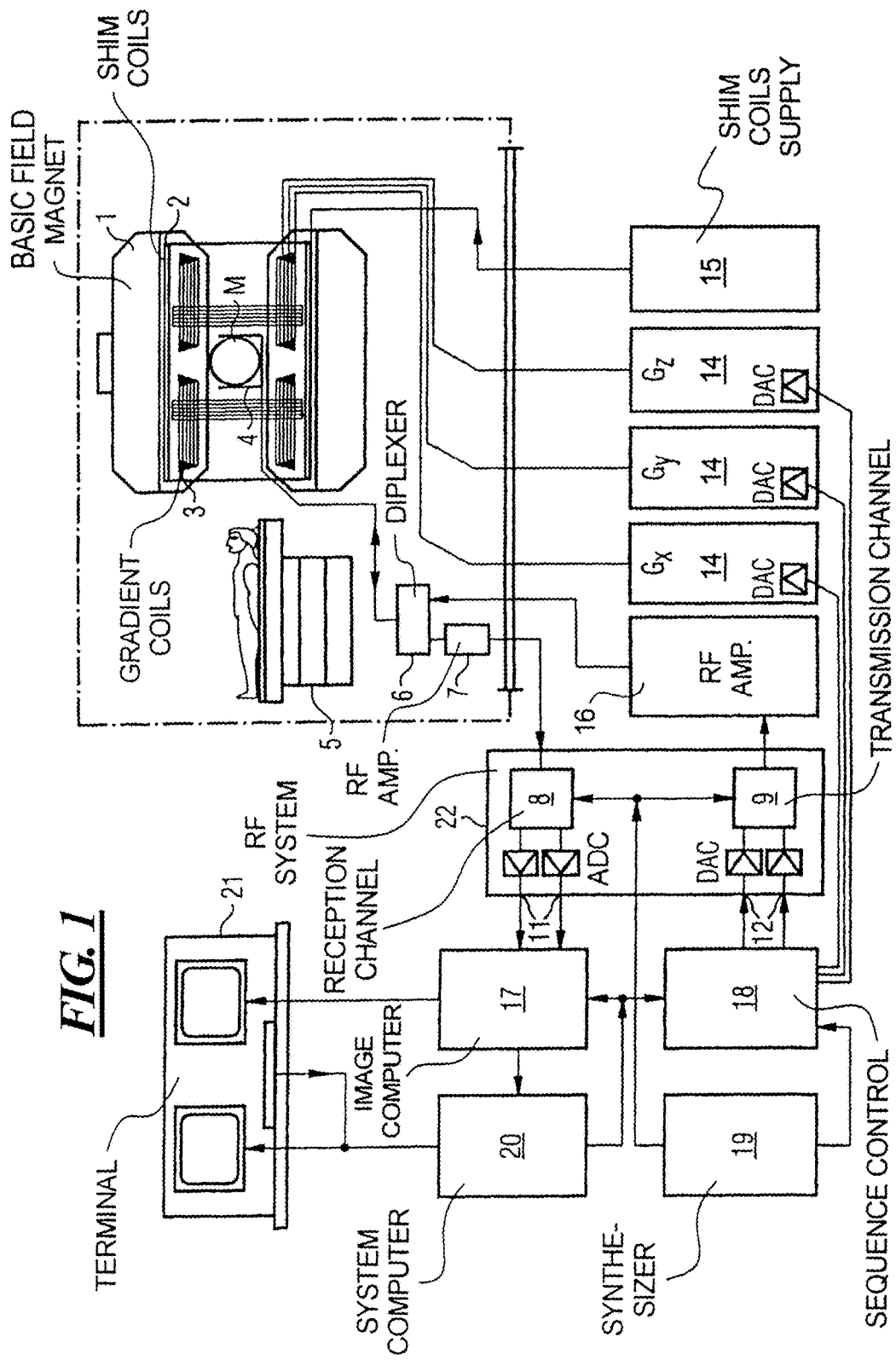
FIG. 1 schematically illustrates a magnetic resonance apparatus that can be operated in accordance with the present invention.

FIG. 1 is a schematic representation of a magnetic resonance system (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The body lies on a table 5 and is examined in the magnetic resonance system. The high homogeneity of the basic magnetic field that is required for the magnetic resonance measurement (data acquisition) is defined in a typically (but not necessarily) spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2 operated by a shim coils amplifier 27.

A cylindrical gradient coil system 3 composed of three sub-windings is used in the basic field magnet 1. Each sub-winding is supplied with current by an amplifier to generate, for example, a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier comprises a digital/analog converter which is activated by a sequence controller 18 for accurately-timed generation of gradient pulses.

Located within the gradient field system 3 are one (or more) radio-frequency antennas 4—in particular at least one multichannel RF transmission coil and at least one RF reception coil—that convert the radio-frequency pulses emitted by a radio-frequency power amplifier 28 into an alternating magnetic field for excitation of the nuclei and alignment of the nuclear spins of the examination subject U to be examined, or of the region of the selected region O of the examination subject U that is to be examined. Each radio-frequency antenna 4 is composed of one or more RF transmission coils and multiple RF reception coils in the form of an annular—preferably linear or matrix-like—arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of nuclear magnetic resonance. The respective radio-frequency pulses are digitally represented in the sequence controller 18 as a series of complex numbers based on a pulse sequence predetermined by the system computer 20, which has a computer 24 to determine flip angles adapted to a predetermined signal curve. This number sequence is supplied as a real part and an imaginary part to a digital/analog converter in the radio-frequency system 22 via respective inputs 12, and from said digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set can be reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals.

The time base for the radio-frequency system 22 and the sequence controller 18 is provided by a synthesizer 19. The selection of corresponding control programs to generate an acquisition of magnetic resonance data (which programs are stored on a DVD, for example), the selection of a selected region O that should be excited and from which magnetic resonance data should be received, the specification of a substance with which the selected region O is filled to determine the flip angles for the desired signal curve, and the presentation of a generated MR image take place via a terminal 21 (for example) that has a keyboard 15, a mouse 16 and a monitor 14.

Figure 2:
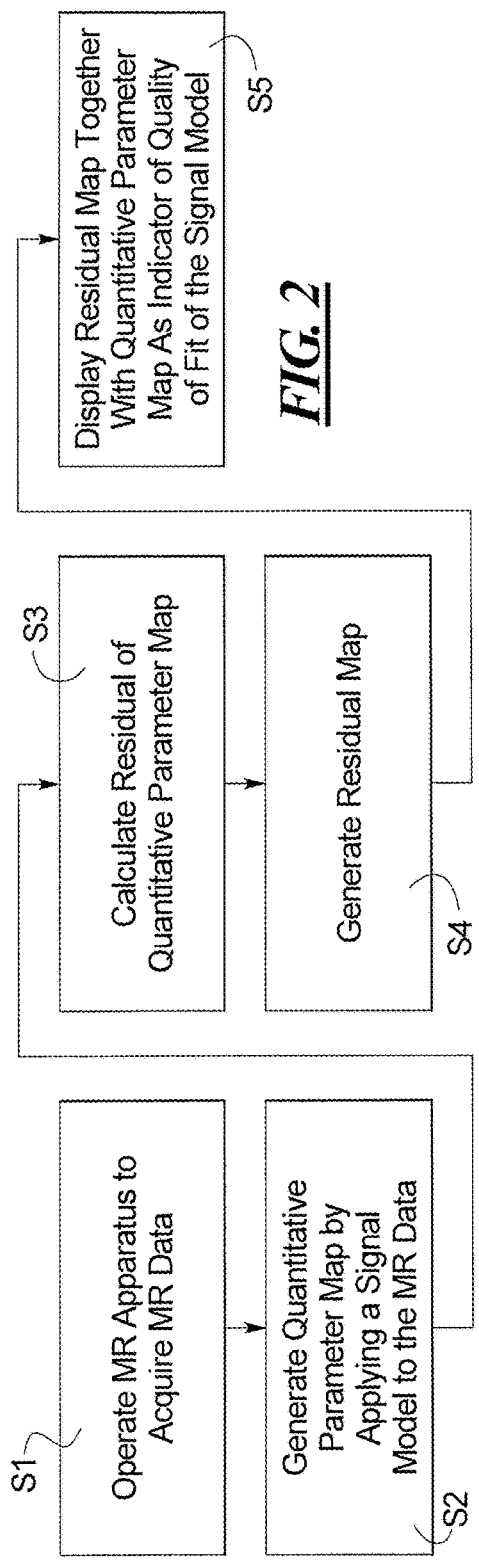
FIG. 2 is a flowchart of the basic steps of the method according to the invention.

FIG. 2 is a flowchart showing the basic steps in accordance with the present invention.

In step S1, the MR apparatus shown in FIG. 1 is operated in order to acquire MR data from a subject. For this purpose, the MR apparatus shown in FIG. 1 may be operated according to a multi-echo gradient echo sequence, for example.

From the acquired MR data, a quantitative parameter map is generated in step S2, by applying a signal model to the MR data. The signal model is of the type described above, which is based on a number of factors that have been selected in the creation of the signal model, either based on pre-diagnostic scan measurements, or based on assumed values. The quality of fit of the signal model is dependent on the extent to which these selected constants correctly correspond to the real values thereof that are dependent on the hardware and operating parameters of the MR apparatus, as well as on the examination subject.

In step S3, a residual of the quantitative parameter map is calculated and, in step S4, a residual map is generated from the calculated residual.

In step S5, the residual map is displayed together with the quantitative parameter map. The residual map serves as an indicator of the quality of fit of the signal model.

Figure 3:
FIG. 3 illustrates an example of residual maps generated in accordance with the invention.

Examples of signal maps obtained in accordance with the invention are shown in FIG. 3. It can be seen that the marked (circled) region in the left liver lobe stands out from the consistency metric map (residual map). In this case, the fit error is expressed as a percentage of the grayscale range, which is between 0 and 1,000, and thus the fit error has a value in a range between 0 and 100 percent.

A conventional fat fraction map is shown in the center of FIG. 3, therein it can be seen at the same region is not as readily apparent. The figure at the right in FIG. 3 is a transverse relaxation map, wherein it can be seen that the marked region exhibits and elevated transverse relaxation.

In this case, the elevated fit error originates most likely not from a pathology, but from a homogeneity in the basic magnetic field, which may also be a source of the detected signals not being in accordance with the signal model. A similar appearance can be expected, however, if the tissue type does not match the signal model, for example, because the fat composition is different from that which would be expected in the liver from a patient population whose statistics are used to generate the model.

Figure 4:
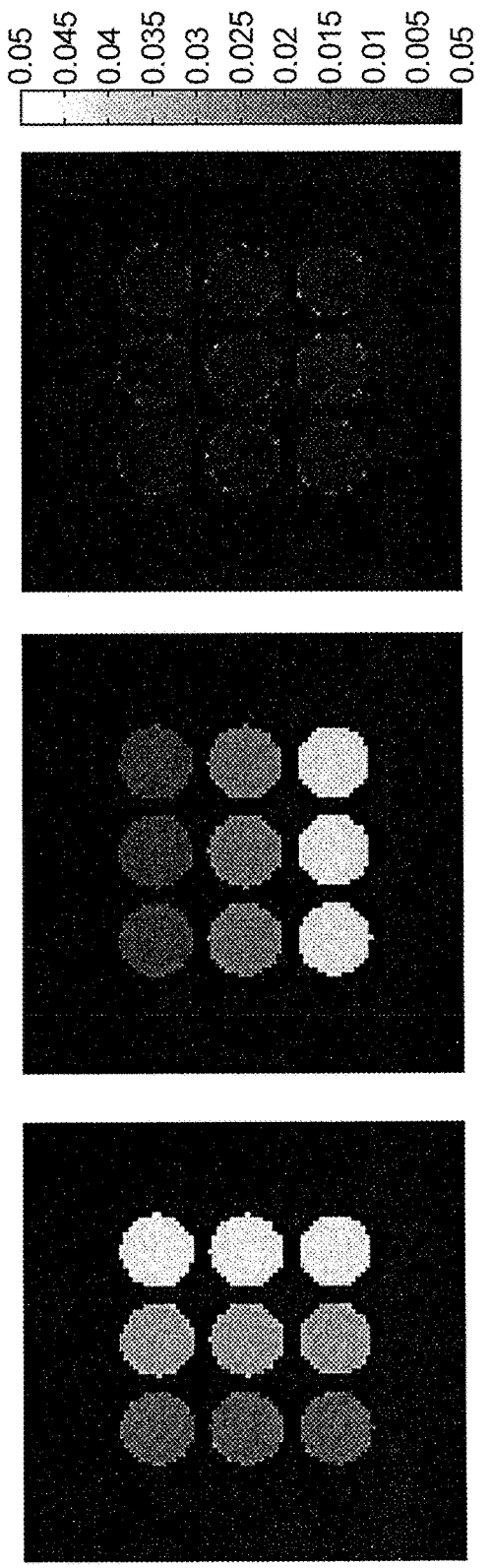
FIG. 4 shows images produced by the method according to the invention in a simulation study, which illustrate no fat model mismatch.
Figure 5:
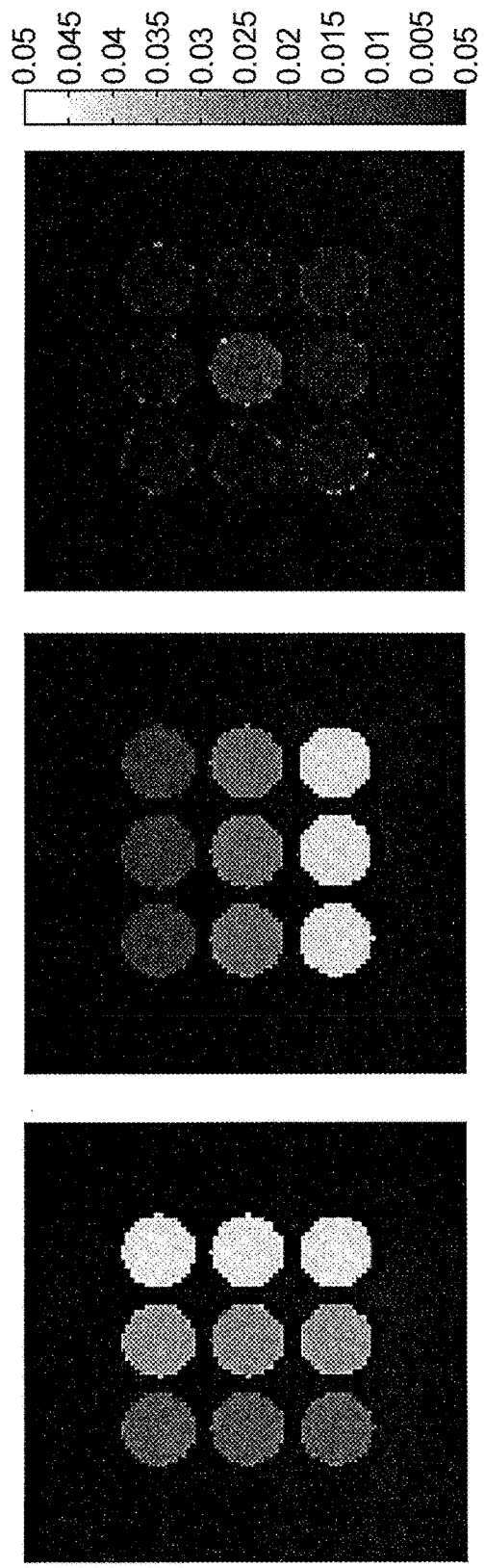
FIG. 5 shows images produced by the method according to the invention in the simulation study, which show a fat model mismatch.

In order to illustrate the efficacy of the method described above in the absence of available clinical data acquired from patients, a simulation study was implemented making use of nine "tube phantoms." In the simulation study shown in FIG. 4, all nine phantoms were the same, and in the study shown in FIG. 5, the center phantom had a slightly different fat composition. The fat signal of the center phantom in FIG. 5 was simulated using the fat spectral model described by Ren et al in Journal of Lipid Research, whereas the other phantoms in FIG. 5, and all of the phantoms in FIG. 4, use the fat spectral model described by Hamilton et al. in NMR Biomedicine. Both types of fat signal model are derived from measured fat spectra, and both are used as model parameters in the literature.

In each of FIGS. 4 and 5, a pixel-by-pixel parameter estimation was made from synthetic raw data, in order to generate a fat fraction map shown at the left of each figure, and an R2* map as shown in the center of each figure, and a fit error map in accordance with the inventive method, shown at the right of each of FIGS. 4 and 5.

FIG. 4 shows no fat model mismatch, in view of the fact that all of the nine phantoms are the same. FIG. 5 illustrates a fat model mismatch, with the center phantom, as noted above, having a slightly different fat composition. This difference is barely visible in either the fat fraction map or the R2* map shown in FIG. 5, but is clearly visible in the fit error map shown in FIG. 5.

Although modifications and changes may be suggested by those skilled in the art, it is the intention of the inventor to embody within the patent warranted hereon all changes and modifications as reasonably and properly come within the scope of their contribution to the art.

We claim as our invention:

1. A method for operating a magnetic resonance (MR) apparatus, comprising:
    operating an MR apparatus, in which a subject is situated, to acquire MR data from the subject;
    providing the acquired MR data to a computer and, in said computer, (a) generating a quantitative parameter map, of one or more parameters represented in said MR data, by applying a signal model to the MR data;
    in said computer, (b) calculating a residual of a fit of the signal model to the MR data;
    in said computer, (c) generating a residual map from the calculated residual, said residual map representing a quality of said fit residual;
    in said computer, repeat (a), (b) and (c) in a plurality of iterations until said residual map represents an acceptable quality of said fit; and
    at a display in communication with said computer, displaying the residual map of a last of said iterations, together with the quantitative parameter map of said last of said iterations.

2. A method as claimed in claim 1 comprising operating said MR apparatus according to a multi-echo gradient echo sequence to acquire said MR data.

3. A method as claimed in claim 2 comprising generating a fat fraction map as said quantitative parameter map.

4. A method as claimed in claim 2 comprising generating a transverse relaxation map as said quantitative parameter map.

5. A magnetic resonance apparatus comprising:
    a magnetic resonance data acquisition unit, configured to receive an examination subject therein;
    a control computer configured to operate said MR data acquisition unit, with said examination subject therein, to acquire MR data from the examination subject;
    a computer provided with said MR data, said computer being configured to (a) generate a quantitative parameter map by applying a signal model to said MR data;
    said computer being configured to (b) calculate a residual of a fit of said quantitative parameter map;
    said computer being configured to generate a residual map from said residual of said quantitative parameter map, said residual map representing a quality of said fit residual;
    said computer being configured to repeat (a), (b) and (c) in a plurality of iterations until said residual map represents an acceptable quality of said fit;
    a display in communication with said computer; and
    said computer being configured to cause said residual map a last of said iterations, together to be visually presented at said display, together with said quantitative parameter map of said last of said iterations.

6. An apparatus as claimed in claim 5 wherein said control computer is configured to operate said MR data acquisition unit according to a multi-echo gradient echo sequence, to acquire said MR data.

7. An apparatus as claimed in claim 5 wherein said computer is configured to calculate a fat fraction map as said quantitative parameter map.

8. An apparatus as claimed in claim 5 wherein said computer is configured to generate a transverse relaxation map as said quantitative parameter map.

9. A non-transitory, computer-readable data storage medium encoded with programming instructions, said storage medium being loaded into a computerized control and processing computer system of a magnetic resonance apparatus, and said control instructions causing said computerized control and processing system to:
    operate an MR apparatus, in which a subject is situated, to acquire MR data from the subject;
    (a) generate a quantitative parameter map, of a parameter represented in said MR data, by applying a signal model to the MR data;
    (b) calculate a residual of the quantitative parameter map;
    (c) generate a residual map from the calculated residual of the quantitative parameter map, said residual map representing a quality of said fit residual;
    repeat (a), (b) and (c) in a plurality of iterations until said residual map represents an acceptable quality of said fit; and
    at a display in communication with said computer, display the residual map together with the quantitative parameter map, with said displayed residual maps serving as an indicator of a quality of fit of said signal model.

* * * * *